(12) United States Patent
Wallace

(10) Patent No.: US 7,170,011 B2
(45) Date of Patent: Jan. 30, 2007

(54) SYSTEM AND METHOD FOR MODIFYING ELECTRICAL CHARACTERISTICS

(75) Inventor: Raymond Curtis Wallace, San Diego, CA (US)

(73) Assignee: Kyocera Wireless Corp., San Diego, CA (US)

( * ) Notice: Subject to any disclaimer, the term of this patent is extended or adjusted under 35 U.S.C. 154(b) by 103 days.

(21) Appl. No.: 10/657,457

(22) Filed: Sep. 8, 2003

(65) Prior Publication Data

US 2005/0051357 A1    Mar. 10, 2005

(51) Int. Cl.
*H05K 1/03*    (2006.01)
(52) U.S. Cl. .................. 174/256; 333/35; 333/165; 333/185
(58) Field of Classification Search ............... 333/35, 333/206, 165, 185, 204, 246, 263; 174/256
See application file for complete search history.

(56) References Cited

U.S. PATENT DOCUMENTS

| | | | | |
|---|---|---|---|---|
| 5,528,207 | A * | 6/1996 | Ito | 333/206 |
| 6,621,377 | B2 * | 9/2003 | Osadchy et al. | 333/161 |
| 2002/0175779 | A1 * | 11/2002 | Levine et al. | 333/104 |
| 2004/0095202 | A1 * | 5/2004 | Brown et al. | 333/35 |

* cited by examiner

*Primary Examiner*—Dean A. Reichard
*Assistant Examiner*—Yuriy Semenenko

(57) ABSTRACT

System and methods for modifying an electrical parameter of an electrical component are described. The system includes an electrical component disposed on a circuit board and a dielectric material. The electrical component has an electrical parameter that is sensitive to a dielectric constant of a substance proximate to the electrical component. The dielectric material is attached to the circuit board proximate to the electrical component and modifies the electrical parameter of the electrical component.

23 Claims, 1 Drawing Sheet

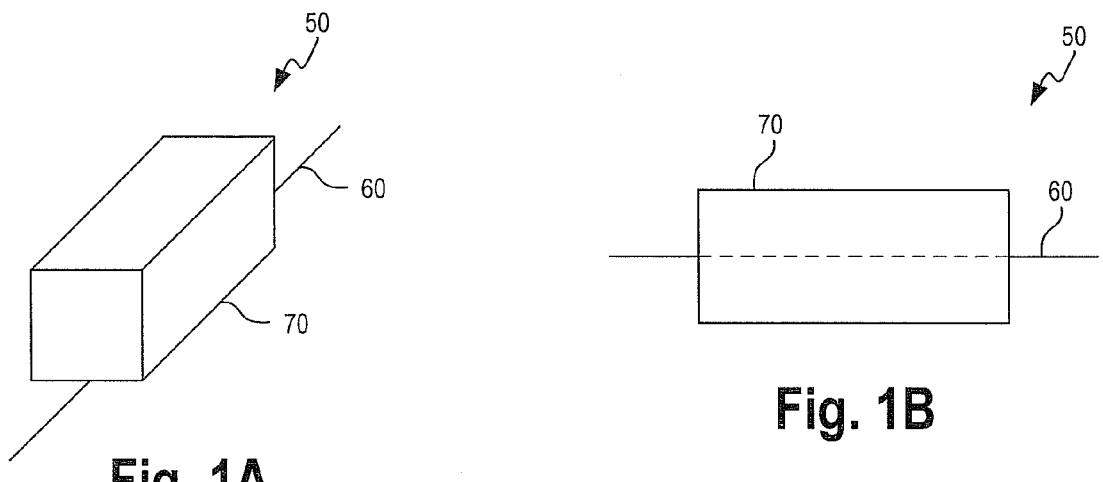
Fig. 1A
Fig. 1B
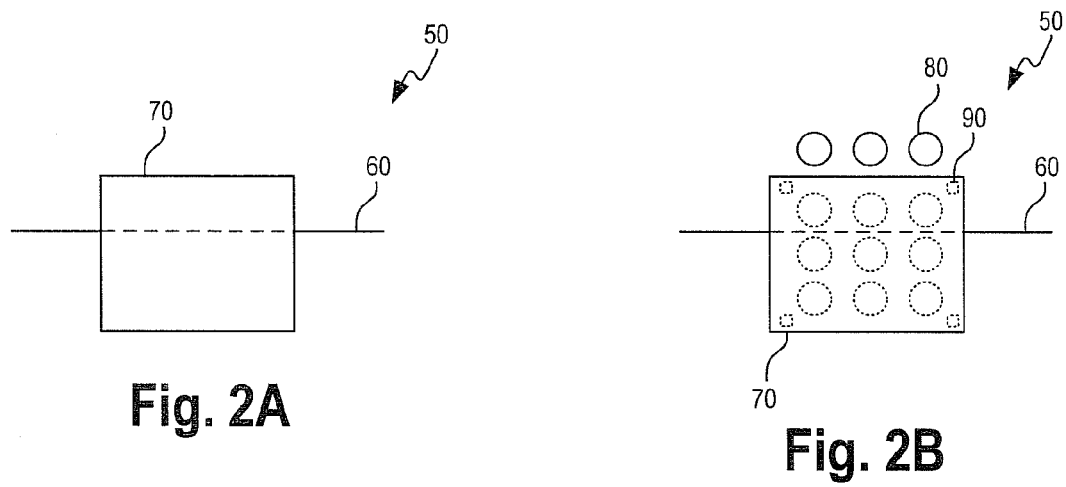
Fig. 2A
Fig. 2B
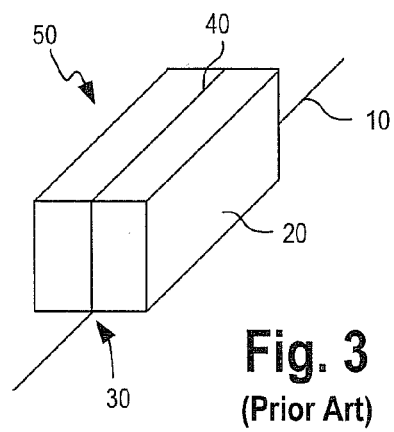
Fig. 3
(Prior Art)

SYSTEM AND METHOD FOR MODIFYING ELECTRICAL CHARACTERISTICS

FIELD OF THE INVENTION

The present invention generally relates to systems and methods that modify electrical characteristics.

BACKGROUND OF THE INVENTION

Handheld wireless communications devices often employ, for example, quarter-wave transformers for cellular, personal communications services (PCS) or global positioning system (GPS) frequency bands. Such quarter-wave transformers, when not adapted, are typically much longer than can be easily accommodated by most handheld wireless communications devices.

In order to reduce the length of such quarter-wave transformers, a block 20 of dielectric material is used as shown in FIG. 3. FIG. 3 shows a trace 10 that has been printed on a circuit board 50. The trace 10 is not continuous as a space was provided onto which the dielectric block 20 could be mounted. The dielectric block 20 already has a trace 40 printed on its surface across three faces of the block 20. The dielectric block 20 must be carefully aligned when it is mounted to avoid any discontinuities at point 30 between trace 10 of the board 50 and trace 40 of the block 20. If successful, the dielectric block 20 modifies the electrical properties of the trace 10, 40 such that a shorter trace can be used for a quarter-wave transformer, for example.

As is evident from FIG. 3, there is very little room for error concerning the proper alignment of the traces 10, 40. Not only must the traces 10, 40 be connected, but they must be well aligned since misaligned (albeit connected) traces 10, 40 provide variances from the expected electrical characteristics of the trace 10, 40 which can have deleterious effects on the handheld wireless communications device, especially during mass production.

In addition, since the block can only be mounted in one way, that is, with the traces 10, 40 aligned and connected, there is no easy way in which to modify the electrical characteristics of the trace 10, 40 in situ. Thus, a degree of flexibility is lost especially in light of the variability of the electrical characteristics of the traces 10, 40.

Accordingly, there exists a need for a method and a system of modifying the electrical characteristics of a trace that provide robust, well-aligned trace connections and also provides flexibility to change electrical properties in situ.

SUMMARY OF THE INVENTION

The present invention alleviates to a great extent the disadvantages of conventional apparatus and methods for providing a multiband antenna.

In a preferred embodiment, the present invention provides an electrical component disposed on a circuit board and a dielectric material. The electrical component has an electrical parameter that is sensitive to a dielectric constant of a substance proximate to the electrical component. The dielectric material is attached to the circuit board proximate to the electrical component and modifies the electrical parameter of the electrical component.

The present invention has an advantage in that the dielectric material is not required to complete the electrical component. Accordingly, problems such as alignment and continuity of the electrical component are reduced, if not eliminated.

The present invention also has an advantage in that the electrical properties of the electrical component can be modified, in situ, by placing the dielectric material in a different position or a different orientation relative to the electrical component.

These and other features and advantages of the present invention will be appreciated from review of the following detailed description of the present invention, along with the accompanying figures in which like reference numerals refer to like parts throughout.

BRIEF DESCRIPTION OF THE DRAWINGS

FIG. 1A shows a perspective view of a dielectric block mounted on top of a trace according to the present invention;

FIG. 1B shows a top view of the dielectric block mounted on top of a trace according to the present invention;

FIG. 2A shows a top view of the dielectric block mounted at a particular displacement from the trace according to the present invention;

FIG. 2B shows a top view of the dielectric block attached to a circuit board via adhesive dots according to the present invention; and FIG. 3 shows a conventional arrangement between a dielectric block and a trace.

DETAILED DESCRIPTION OF THE INVENTION

FIGS. 1A and 1B illustrate an exemplary embodiment of a dielectric material 70 disposed on top of a trace 60 according to the present invention. The trace 60 may be printed or deposited on the circuit board 50. Subsequently, the dielectric material is mounted or deposited on top of trace 60.

Such a system may find application in wireless communications devices, for example, for use in a quarter-wave transformer. However, the present invention is not so limited and contemplates uses in any application in which the electrical properties may be modified or optimized. For example, the trace may be part of an antenna, an inductor, a capacitor, a resonating structure, transmission lines, waveguides, etc. In addition, although illustrated as using a trace, the present invention contemplates using other electrical components known to one of ordinary skill in the art.

Since there is only the one trace 60, there are no trace-to-trace continuity and alignment problems which might affect the electrical characteristics of the trace. In addition, since the disposition of the dielectric material 70 with respect to the trace 60 affects the electrical properties of the trace 60, the dielectric material 70 can be mounted in different orientations and positions with respect to the trace 60 to optimize the expected electrical properties of the trace 60.

For example, FIG. 2A shows the dielectric material 70 that has been displaced, for example, along a direction that is perpendicular to the axis of the trace 60. The trace 60 illustrated in FIG. 2A has different electrical properties than the trace 60 illustrated in FIG. 1B. Furthermore, although FIG. 2A illustrates a particular displacement and orientation of the dielectric material 70 with respect to the trace 60, it is understood that there are a wide variety of displacements and orientations of the dielectric material 70 from which to choose to provide additional degrees of freedom in optimizing or achieving particular electrical properties of the trace 60.

FIG. 2B illustrates that adhesive dots 80 mounted on the circuit board 50 may be used to hold the dielectric material 70 to the circuit board 50. Accordingly, the dielectric material 70 can easily be attached and detached from circuit board 50. Thus, in attempting to achieve an optimized or particular electrical property of the trace 60, the dielectric material 70 can be displaced or reoriented and easily mounted or dismounted from the circuit board 50. With each mounting of the dielectric material 70, the trace 60 could be tested to see if the particular electrical property had been achieved or optimized. Thus, for example, the trace 60 can be optimized for cellular band frequencies when the dielectric material 70 is in a first orientation and position, while the trace 60 can be optimized for PCS band frequencies when the dielectric material 70 is in a second orientation and position.

Although illustrated as adhesive dots 80 mounted on the circuit board 50, other types and shapes of adherents may be used to attach and to detach the dielectric material 70. For example, physical hooks or receptors could be mounted on the circuit board 50 in order to hold the dielectric material 70 on the circuit board 50. In addition, the adhesive dots 80 may be disposed on the dielectric material 70 instead or in addition to the adhesive dots 80 on the circuit board 50. FIG. 2B also illustrates an example of adhesive pads 90 on the dielectric material that can be used to attach the dielectric material to the circuit board 50.

In addition, although the dielectric material 70 has been illustrated as a block, the dielectric material 70 can take on any number of shapes and forms. Moreover, although the trace 60 has been illustrated as a line trace, other shapes and forms of the trace 60 known in the art are also contemplated. In addition, the particular choices available for materials for use in the dielectric material 70 and the trace 60 are well known in the art.

Although the dielectric material 70 has been illustrated as being on top of the trace 60, the dielectric material 70 could equally be mounted under the trace 60. For example, the trace 60 could be disposed on a first side of the circuit board 50 and the dielectric material 70 could be disposed on the second (opposite) side of the circuit board 50.

Finally, although the dielectric material 70 has been illustrated in contact with the trace 60, the dielectric material 70 may be in contactless proximity of the trace 60. Such contactless proximity can still affect the electrical properties of the trace 60.

Thus, it is seen that systems and methods for modifying electrical properties have been described. One skilled in the art will appreciate that the present invention can be practiced by other than the preferred embodiments which are presented in this description for purposes of illustration and not of limitation, and the present invention is limited only by the claims that follow. It is noted that equivalents for the particular embodiments discussed in this description may practice the present invention as well.

What is claimed is:

1. A quarter-wave transformer in a handheld wireless communications device, comprising:
   a conductive trace positioned on a substrate, at least a portion of the conductive trace defining a trace axis on the substrate; and
   a dielectric block consisting of solid dielectric material, the dielectric block having a block edge, the dielectric block mounted on the substrate in proximity to the conductive trace and with the block edge rotated to a target orientation with respect to the trace axis to obtain a desired electrical property of the conductive trace.

2. The quarter-wave transformer of claim 1, wherein the dielectric block is in direct contact with the conductive trace.

3. The quarter-wave transformer of claim 1, wherein the dielectric block is disposed above the conductive trace.

4. The quarter-wave transformer of claim 1, wherein the dielectric block is disposed below the conductive trace.

5. The quarter-wave transformer of claim 1, wherein the target orientation is a first orientation for optimizing the trace for cellular band frequency communication.

6. The quarter-wave transformer of claim 1, wherein the target orientation is a second orientation for optimizing the trace for personal communications services (PCS) communication.

7. The quarter-wave transformer of claim 1, wherein the target orientation is a third orientation for optimizing the trace for global positioning system (GPS) frequency communication.

8. A circuit card assembly, comprising: a printed circuit board (PCB); an electrical component mounted on the PCB, the electrical component having a component edge; and a dielectric block mountable on the PCB at a plurality of angles with respect to the component edge, the dielectric block consisting of a solid dielectric material having a dielectric constant for modifying at least one electrical parameter of the electrical component, wherein the dielectric block mounted at a first angle of the plurality of angles produces a desired modification of the at least one electrical parameter.

9. The circuit card assembly according to claim 8, wherein the dielectric block is attached to the printed circuit board and is disposed on top of the electrical component.

10. The circuit card assembly according to claim 8, wherein the dielectric block is attached to the printed circuit board and is disposed under the electrical component.

11. The circuit card assembly according to claim 8, wherein the electrical component is a trace.

12. The circuit card assembly according to claim 8, wherein the dielectric block is attached to the printed circuit board via adhesive dots attached to the printed circuit board.

13. The circuit card assembly according to claim 8, wherein the dielectric block is attached to the printed circuit board utilizing non-conductive pads attachable from a surface of the dielectric block to the circuit card assembly.

14. The circuit card assembly according to claim 8, wherein the dielectric block is in direct contact with the electrical component.

15. The circuit card assembly according to claim 8, wherein the electrical component is a quarter-wave transformer.

16. The circuit card assembly according to claim 8, wherein the dielectric component is attached to the printed circuit board at a second angle of the plurality of angles for optimizing the trace for cellular band frequency communication.

17. The circuit card assembly according to claim 8, wherein the dielectric component is attached to the printed circuit board at a third angle of the plurality of angles for optimizing the trace for personal communications services (PCS) communication.

18. The circuit card assembly according to claim 8, wherein the dielectric component is attached to the printed circuit board at a fourth angle of the plurality of angles for optimizing the trace for global positioning system (GPS) frequency communication.

19. A method for modifying an electrical parameter of an electrical component on a surface of a printed circuit board, comprising the steps of:

(a) placing a dielectric block in proximity to the electrical component, the dielectric block consisting of a solid dielectric material having a dielectric constant, the dielectric component modifying the electrical parameter of the electrical component as a function of an orientation of the dielectric block relative to the electrical component; and (b) modifying the electrical parameter to a desired electrical parameter by rotating the dielectric component to a target angle with respect to an edge of the electrical component.

20. The method according to claim 19, wherein step(a) includes the step of disposing the dielectric block on top of the electrical component.

21. The method according claim 19, wherein step(a) includes the step of placing the dielectric block in direct contact with the electrical component.

22. The method according to claim 19, further comprising the steps of:

(c) testing the electrical parameter of the electrical component; and (d) if the tested electrical parameter is not approximately an intended value, then rearranging the dielectric block relative to the electrical component until the tested electrical parameter is approximately the intended value.

23. The method according to claim 19, further comprising the step of:

(c) modifying, in situ, the electrical parameter of the electrical component by changing the orientation of the dielectric block relative to the electrical component.

\* \* \* \* \*